United States Patent
Okada et al.

[11] Patent Number: 6,096,575
[45] Date of Patent: Aug. 1, 2000

[54] OPTIMUM CONDITION DETECTION METHOD FOR FLIP-CHIP

[75] Inventors: Yoshio Okada, Sendai; Takayoshi Katahira, Tokyo, both of Japan

[73] Assignee: Motorola, Inc., Schaumburg, Ill.

[21] Appl. No.: 09/384,934

[22] Filed: Aug. 26, 1999

[30] Foreign Application Priority Data

Sep. 30, 1998 [JP] Japan ................................. 10-276943

[51] Int. Cl.$^7$ ........................... H01L 21/44; H01L 21/48; H01L 21/50
[52] U.S. Cl. ........................ 438/106; 436/107; 436/108; 436/455
[58] Field of Search .................................. 438/106, 107, 438/108, 455

[56] References Cited

U.S. PATENT DOCUMENTS 5,763,288  6/1998  Sakaguchi et al. ..................... 438/455
5,928,458  7/1999  Aschenbrenner et al. .

*Primary Examiner*—Kevin M. Picardat
*Assistant Examiner*—D. M. Collins
*Attorney, Agent, or Firm*—A. Kate Huffman

[57] ABSTRACT

An optimum condition detection method for flip-chip bonding that facilitates simple detection of optimum pressure and heating temperature for flip-chip bonding implemented by use of bonding material is provided.

Pressure applied to a semiconductor chip is increased at a first predetermined rate so that the semiconductor chip is pressed against a substrate until contact pressure applied through an anisotropic conductive film or the like between a bump of the semiconductor chip and a pad of the substrate reaches below a first setup value; the heating temperature for the semiconductor chip is increased at a second predetermined rate until the temperature of the semiconductor chip reaches above a setup temperature; when the contact resistance reaches below the first setup value and the temperature of the semiconductor chip reaches above the setup temperature, the pressure applied to the semiconductor chip and the heating temperature for the semiconductor chip are kept constant, under which condition after a predetermined period of time has elapsed, the pressure applied to the semiconductor chip and heating temperature for the semiconductor chip are decreased, respectively.

6 Claims, 3 Drawing Sheets

# OPTIMUM CONDITION DETECTION METHOD FOR FLIP-CHIP

FIELD OF THE INVENTION

The present invention relates to an optimum condition detection method for flip-chip bonding that employs bonding material such as anisotropic conductive film.

BACKGROUND OF THE INVENTION

Flip-chip bonding is a technique for directly bonding bumps of a semiconductor chip onto pads of a substrate in order to mount the semiconductor chip onto the substrate. With flip-chip bonding, bumps of a semiconductor chip are typically aligned to pads of a substrate and the bumps of the semiconductor chip are then pressed to the pads of the substrate and heated to melt them together, whereby the bumps of the semiconductor chip are bonded to the pads of the substrate.

Techniques of using anisotropic conductive film for flip-chip bonding are being put to practical use. The anisotropic conductive film, or ACF, is a bonding material made of resin, such as epoxy, that contains conductive particles. With flip-chip bonding by use of anisotropic conductive film, the anisotropic conductive film is attached to a bonding surface of the substrate in contact with the semiconductor chip; the bumps of the semiconductor chip are aligned to the pads of the substrate; the bumps of the semiconductor chip are then pressed against the pads of the substrate to secure electrical contact between the bumps and pads; and the anisotropic conductive film is heated and cured, thereby anchoring the bumps of the semiconductor chip to the pads of the substrate.

However, with flip-chip bonding by use of such anisotropic conductive film, if the pressure applied to press the bumps of the semiconductor chip to the pads of the substrate is insufficient, sufficient electrical contact between the bumps and pads is not obtained; on the other hand, if the pressure is excessive, the substrate may be damaged. If heating is insufficient or excessive, the resin would not be cured with sufficient residual stress maintained after the pressure is released. In this way, the problem is that it is difficult to provide optimum pressure and heating for flip-chip bonding by use of such bonding material.

Accordingly, it is an object of the present invention to provide an optimum condition detection method for flip-chip bonding that permits simple detection of pressure and heating temperature most suited for flip-chip bonding by use of bonding material.

SUMMARY OF THE INVENTION

An optimum condition detection method for flip-chip bonding according to the present invention encompasses an optimum condition detection method, where a bonding material is inserted between a semiconductor chip and a substrate to implement flip-chip bonding, said method comprising: a first step wherein pressure applied to the semiconductor chip is increased at a first predetermined rate so that the semiconductor chip is pressed against the substrate until contact resistance applied through the bonding material between at least one of a plurality of bumps of the semiconductor chip and a pad of the substrate corresponding to the bump reaches below a first setup value; a second step wherein when the contact resistance has reached below the first setup value, the pressure applied to the semiconductor chip is kept constant, and the heating temperature for the semiconductor chip is increased at a second predetermined rate until the temperature of the semiconductor chip reaches above a setup temperature; and a third step wherein when the temperature of the semiconductor chip has reached above the setup temperature, the pressure applied to the semiconductor chip and the heating temperature for the semiconductor chip are kept constant, under which condition after a predetermined period of time has passed, the heating temperature for the semiconductor chip is decreased.

An optimum condition detection method for flip-chip bonding according to the present invention also encompasses an optimum condition detection method, where a bonding material is inserted between a semiconductor chip and a substrate to implement flip-chip bonding, said method comprising: a third step wherein heating temperature for the semiconductor chip is increased at a second predetermined rate until the temperature of the semiconductor chip reaches above a setup temperature; a first step wherein once the temperature of the semiconductor chip has reached above the setup temperature, pressure applied to the semiconductor chip is increased at a first predetermined rate so that the semiconductor chip is pressed against the substrate until contact resistance applied through the bonding material between at least one of a plurality of bumps of the semiconductor chip and a pad of the substrate corresponding to the bump reaches below a first setup value; and a second step wherein when the contact resistance has reached the first setup value, the pressure applied to the semiconductor chip and the heating temperature for the semiconductor chip are kept constant, under which condition after a predetermined period of time has passed, the heating temperature for the semiconductor chip is decreased.

Furthermore, an optimum condition detection method for flip-chip bonding according to the present invention encompasses an optimum condition detection method, where a bonding material is inserted between a semiconductor chip and a substrate to implement flip-chip bonding, said method comprising: a first step wherein pressure applied to the semiconductor chip is increased at a first predetermined rate so that the semiconductor chip is pressed against the substrate until contact resistance applied through the bonding material between at least one of a plurality of bumps of the semiconductor chip and a pad of said substrate corresponding to the bump reaches below a first setup value, while, at the same time, heating temperature for said semiconductor chip is increased at a second predetermined rate until the temperature of the semiconductor chip reaches above a setup temperature; and a second step wherein when the contact resistance has reached below said first setup value and the semiconductor chip temperature has reached above the setup temperature, the pressure applied to the semiconductor chip and the heating temperature for the semiconductor chip are kept constant, under which condition after a predetermined period of time has passed, the heating temperature for the semiconductor chip is decreased.

DESCRIPTION OF A PREFERRED EMBODIMENT

An embodiment of the present invention is described in detail below with reference to the drawings.

Figure 1:
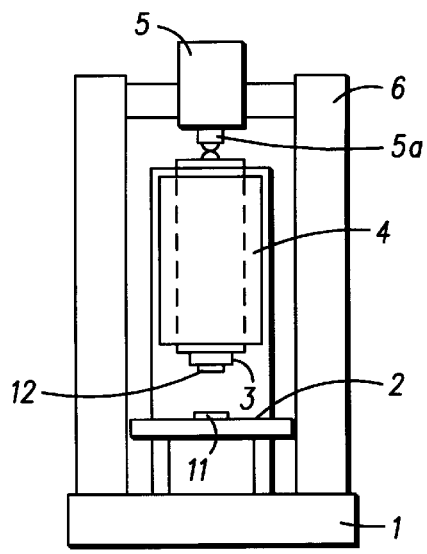
FIG. 1 is a diagram illustrating a thermo-compression bonding test machine that is employed in a flip-chip bonding test system.

FIG. 1 illustrates a thermo-compression bonding test machine that is used in a flip-chip bonding test system that employs an optimum condition detection method according to the present invention. In this thermo-compression bonding test machine, a table-shaped compression stage 2 is fixed on a base 1, and a substrate 11, which is described later, is placed on top of the compression stage 2. Above the compression stage 2 is located a compression tool 3. The compression tool 3 is disposed at the tip of a tool guide section 4 and sucks and holds in place a semiconductor chip 12, which is described later. The compression tool 3 is connected via the tool guide section 4 to a cylinder 5a of a load generating section 5, and is allowed to move vertically in conjunction with the cylinder 5a. The load generating section 5 is supported by a frame 6 that is fixed to the base 1 and operates to apply pressure via the compression tool to the semiconductor chip 12 and substrate 11.

The compression tool 3 contains, although not shown in FIG. 1, a heater 21 that heats an anisotropic conductive film via the semiconductor chip 12; a pressure sensor 22 that detects the pressure applied from the load generating section 5 to the semiconductor chip 12 and substrate 11 as change in resistance value due to distortion caused by that pressure; and a temperature sensor 23 that detects the temperature of the semiconductor chip 12.

Figure 2:
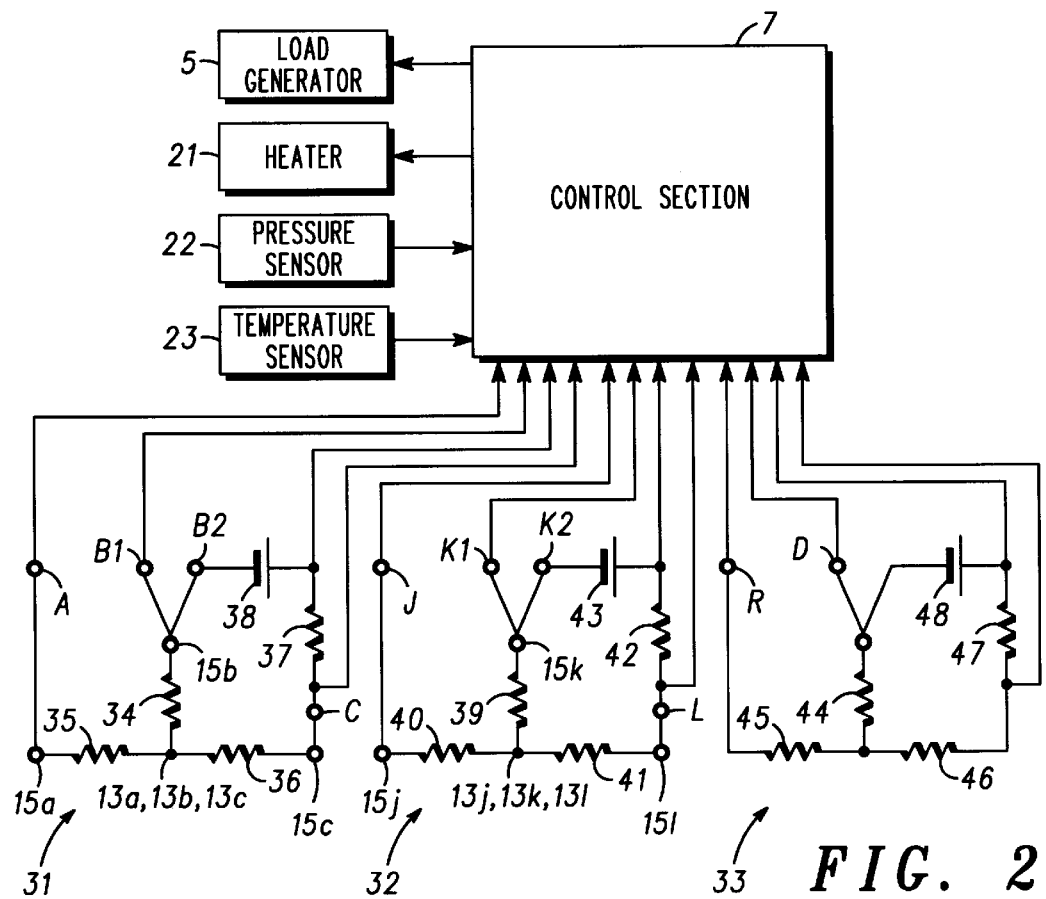
FIG. 2 is a diagram illustrating an electrical configuration of the flip-chip bonding test system.

The load generating section 5, heater 21, pressure sensor 22 and temperature sensor 23 are connected to a control section 7 as shown in FIG. 2. The control section 7, which is comprised of, for example, a microcomputer, performs loading and heating control for the load generating section 5 and heater, respectively, as described later, and also estimates the temperature of the anisotropic conductive film based on the temperature detected by the temperature sensor.

Figure 3:
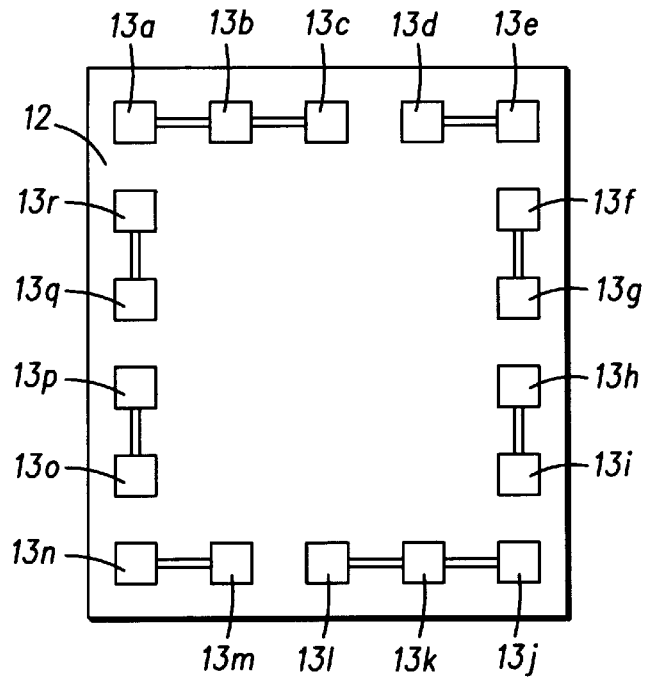
FIG. 3 is a diagram illustrating a bumped surface of a semiconductor chip.

On the bumped surface of the semiconductor chip 12 are formed a plurality of bumps 13a–13r as shown in FIG. 3. In the present embodiment, eighteen bumps 13a–13r are disposed on a periphery of the bumped surface of the semiconductor chip 12.

On the semiconductor chip 12, electrically conductive state is established between bumps 13a, 13b, and 13c; between bumps 13d and 13e; between bumps 13f and 13g; between bumps 13h and 13i; between bumps 13j, 13k, and 13l; between bumps 13m and 13n; between bumps 13o and 13p; and between bumps 13q and 13r, respectively.

Figure 4:
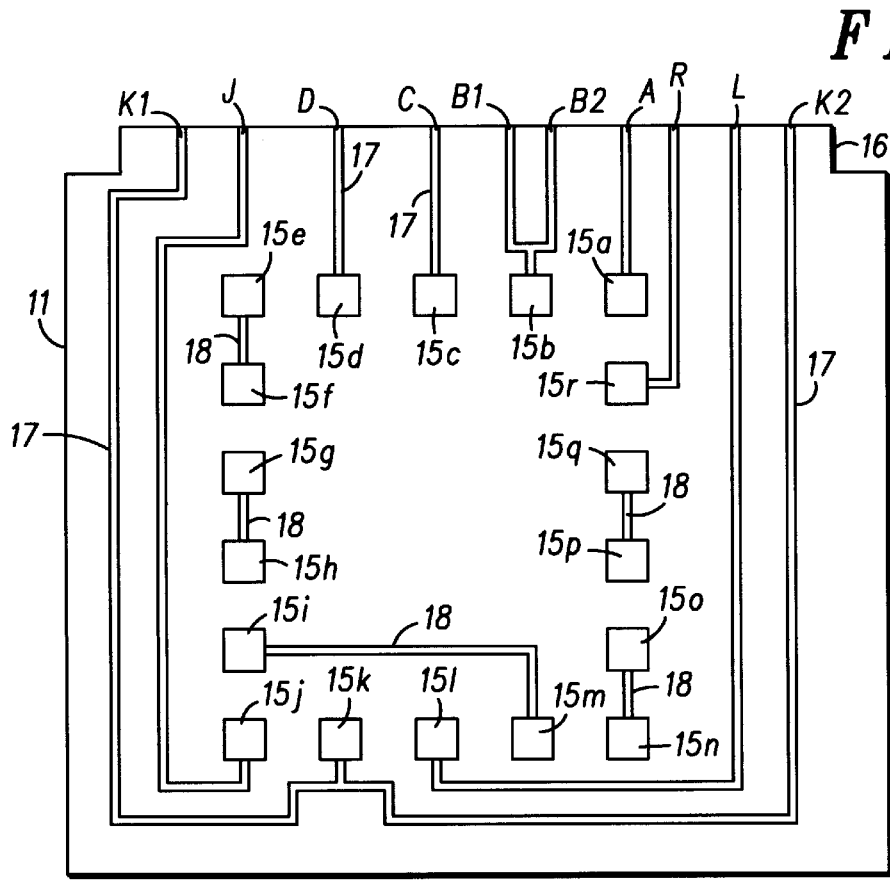
FIG. 4 is a diagram illustrating a patterned surface of a substrate.
Figure 6:
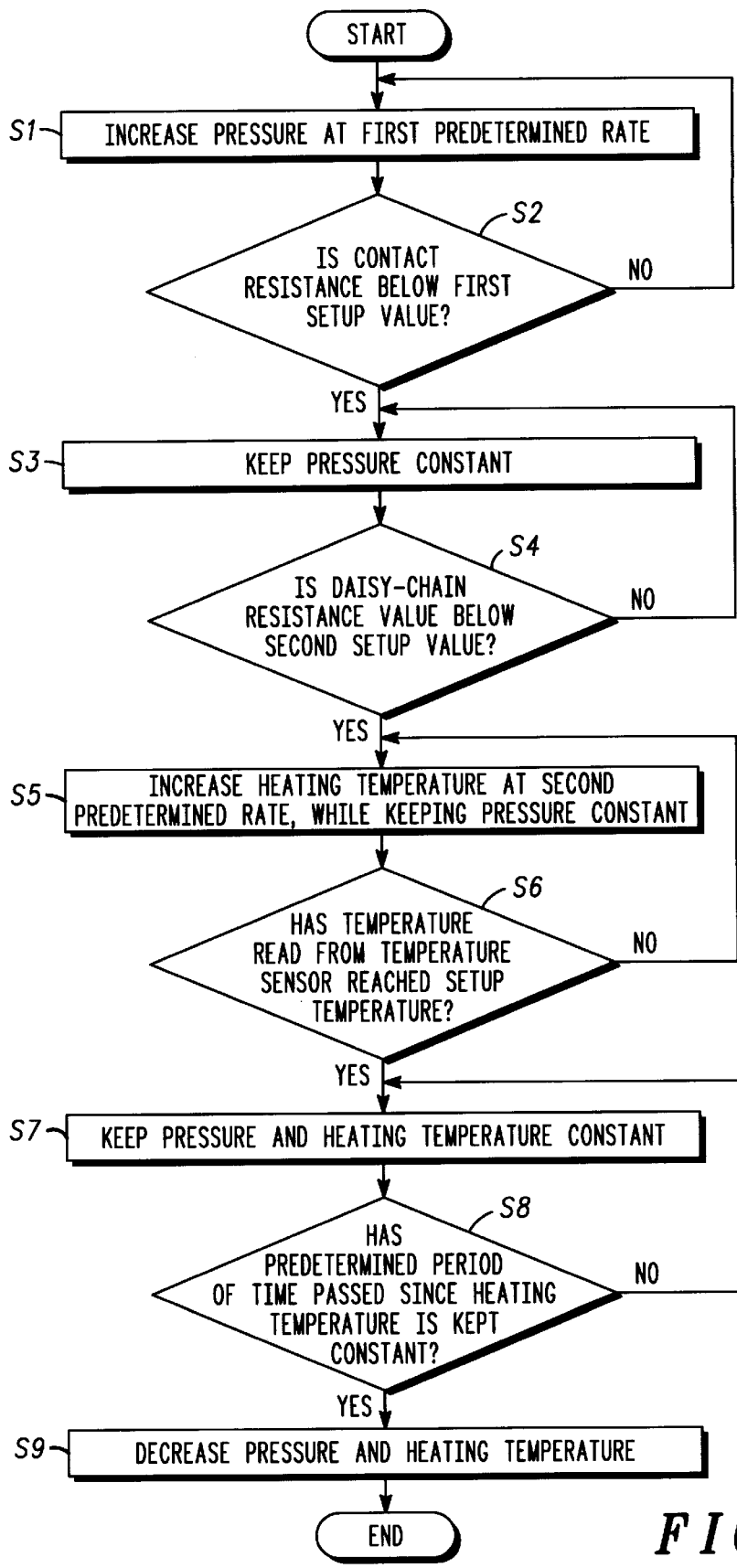
FIG. 6 is a flow chart for describing how optimum condition detection is implemented by the control section.

On the patterned surface of the substrate 11 are formed pads 15a–15r corresponding in position to the bumps 13a–13r of the semiconductor chip 12, as shown in FIG. 4. Patterns 17 are extended to a connector mating section 16 from the pads 15a–15d, 15j–15l, and 15r, respectively. The connector mating section 15 has terminals A, B1, B2, C, D, J, K1, K2, L, and R, which are formed to mate and connect to a connector (not shown). Connections are established by patterns 18 between pads 15e and 15f; between pads 15g and 15h; between pads 15i and 15m; between pads 15n and 15o, and between pads 15p and 15q, respectively.

Figure 5:
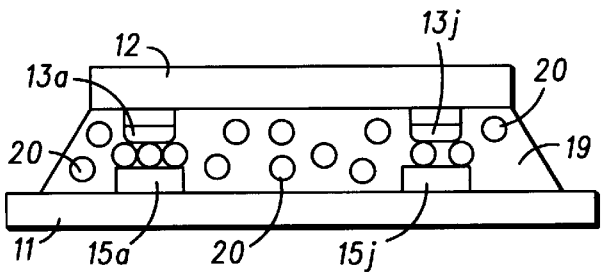
FIG. 5 is a diagram illustrating how bonding is achieved by flip-chip bonding.

Pressure is applied by the load generating section 5 so that the pads 15a–15r of the substrate and the bumps 13a–13r of the semiconductor chip 12 are electrically contacted in alphabetic correspondence, with an anisotropic conductive film provided therebetween, as shown in FIG. 5 where only portions of the pads 15a and 15j and bumps 13a and 13j are shown. The anisotropic conductive film 19 is made of resin, such as epoxy, that contains conductive particles 20.

The control section 7 is electrically wired and connected to the substrate 11 as shown in FIG. 2, thereby forming three independent measurement circuits 31–33. The measurement circuit 31 is comprised of resistors 34–37 and a battery 38. The resistor 34 provides contact resistance between the bump 13b and pad 15b via the anisotropic conductive film 19, and the resistance value of this contact resistor 34 is measured by the measurement circuit 31. The resistor 35 provides contact resistance between the bump 13a and pad 15a via the anisotropic conductive film 19, while the resistor 36 provides contact resistance between the bump 13c and pad 15c via the anisotropic conductive film 19. Because one ends of the resistors 34–36 are the bumps 13a–13c, they are commonly connected as described above. The other end of the resistor 34 is the pad 15b, which is connected to the control section 7 via the terminal B1 and is also connected to a negative terminal of the battery 38 via the terminal B2. The other end of the resistor 35 is the pad 15a, which is connected to the control section 7 via the terminal A, while the other end of the resistor 36 is the pad 15c, which is connected to one end of the resistor 37 via the terminal C. The positive terminal of the battery 38 and the other end of the resistor 37 are connected together. The resistor 37 is a current detecting resistor (having 20 Ω, for example) that is sufficiently large as compared to the afore-mentioned contact resistors 34–36, and the voltage across this resistor 37 is supplied to the control section 7.

The measurement circuit 32 is made up of resistors 39–42 and a battery 43. The resistor 39 provides contact resistance between the bump 13k and pad 15k via the anisotropic conductive film 19, and the resistance value of this contact resistor 39 is measured by the measurement circuit 32. The resistor 40 provides contact resistance between the bump 13j and pad 15j via the anisotropic conductive film 19, while the resistor 41 provides contact resistance between the bump 13l and pad 15l via the anisotropic conductive film 19. The resistor 42 is a current detecting resistor that is sufficiently large as compared to the afore-mentioned contact resistors 39–41. The connection arrangement of the measurement circuit 32 is similar to that of the measurement circuit 31.

The measurement circuit 33 is made up of resistors 44–47 and a battery 48. The resistor 44 provides total resistance (daisy-chain resistance) for contact resistances, via the anisotropic conductive film 19, between the bumps 13d–13i and 13m–13r and pads 15d–15i and 15m–15r daisy-chained from terminal D to terminal R. The measurement circuit 33 is intended to detect the resistance value of this daisy-chain resistance. The resistors 45 and 46 provide wire resistance. The resistor 47 is a current detecting resistor (having 1 kΩ, for example) that is sufficiently large as compared to the afore-mentioned resistors 44–46. The connection arrangement of the measurement circuit 32 is similar to that of the measurement circuit 31 or 32.

The substrate 11 is secured on the compression stage 2 with the anisotropic conductive film 19 attached on its pad surface, and the bumps 13a–13r of the semiconductor chip 12 that is sucked and held at the tip of the compression tool 3 are moved down toward the pads 15a–15r of the substrate 11. Meanwhile, the bumps 13a–13r of the semiconductor chip 12 are aligned with the pads 15a–15r of the substrate 11, so that the bumps 13a–13r and pads 15a–15r are brought into contact with each other via the anisotropic conductive film 19.

Once the bumps 13a–13r and pads 15a–15r are contacted via the anisotropic conductive film 19, the control section 7 initiates the optimization test sequence, where the load generating section 5 is first driven to increase the pressure applied to the semiconductor chip 12 at a first predetermined rate (step S1). By monitoring the pressure read from the pressure sensor 22, an increase in pressure provided by the load generating section 5 is controlled to the first predetermined rate. This causes the bumps 13a–13r and pads 15a–15r to be compressed, with the anisotropic conductive film 19 disposed therebetween, between the compression tool 3 and compression stage 2. After step Sl is executed, the control section 7 determines whether the resistance value of the contact resistance between the bumps of the semiconductor chip 12 and the pads of the substrate 11 is below a first setup value (for example, 10 m$\Omega$) (step S2). This contact resistance is at least one of the contact resistors 34 and 39. For the contact resistor 34, because the voltage applied across the contact resistor 34 is detected as $V_{34}$ based on the voltage developed between the terminals A and B1, while the current flowing through the contact resistor 34 is detected as $I_{34}$ based on the voltage developed across the resistor 37, the resistance value of the contact resistor 34 is $V_{34}/I_{34}$. Similarly, for the contact resistor 39, because the voltage applied across the contact resistor 39 is detected as $V_{39}$ based on the voltage developed between the terminals J and K1, while the current flowing through the contact resistor 39 is detected as $I_{39}$ based on the voltage developed across the resistor 42, the resistance value of the contact resistor 39 is $V_{39}/I_{39}$.

In step S2, if the resistance value of the contact resistor is greater than a first setup value, the process returns to step 1, where the load generating section 5 is driven to increase the pressure at a predetermined rate. When the resistance value of the contact resistor drops below the first setup value, the load generating section 5 is controlled so as to maintain constant the pressure read from the pressure sensor 22 (step S3). Next, the control section 7 determines whether the resistance value of the daisy-chain resistance 44 is below a second setup value (for example, 10 $\Omega$) (step S4). Because the voltage applied across the daisy-chain resistance 44 is detected as $V_{44}$ based on the voltage developed between terminals D and R, while the current flowing through the daisy-chain resistance 44 is detected as $I_{44}$ based on the voltage developed across the resistor 47, the resistance value of the daisy-chain resistor 44 is $V_{44}/I_{44}$.

On the other hand, if the resistance value of the daisy-chain resistor 44 is below a second setup value, the heater 21 is driven to increase the heating temperature for the semiconductor chip 12 at a second predetermined rate, while controlling the load generating section 5 to maintain constant the pressure at a level read from the pressure sensor 22 (step S5). By monitoring the temperature read from the temperature sensor 23, the heating temperature generated by the heater 21 is controlled to the second predetermined rate. Because the heat generated by the heater 21 is transferred to the compression tool 3 and to the anisotropic conductive film 19 via the semiconductor chip 12, the anisotropic conductive film 19 is cured. It is then determined whether the temperature read for the temperature sensor 23 has reached a setup temperature (step S6). If the temperature read from the temperature sensor 23 has not reached the setup temperature, steps 5 and 6 are repeated.

When the temperature read from the temperature sensor 23 has reached the setup temperature, the load generating section 5 and heater 21 are controlled so that the pressure and temperature read from the pressure sensor 22 and temperature sensor 23, respectively, are maintained constant (step S7), and it is determined whether a predetermined period of time (for example, 20 seconds) has passed since the start of temperature maintenance (step S8). If the predetermined period of time has not passed, steps S7 and S8 are repeated. When the predetermined period of time has passed since the start of temperature maintenance, the load generating section 5 and heater 21 are controlled to decrease the pressure and temperature, respectively (step S9).

By performing such an optimization test sequence while varying the first and second setup values and setup temperatures, optimum pressure and temperature conditions are detected such that the deformation of the substrate 11 is minimized and the contact resistance is sufficiently low.

In the above embodiment, if, after the pressure is applied to the semiconductor chip, the resistance value of the contact resistor has reached below the first setup value and the resistance value of the daisy-chain resistor has reached below the second setup value, the pressure applied to the semiconductor chip is kept constant to heat the semiconductor chip; however, after the semiconductor chip temperature has first reached above the setup temperature by heating the semiconductor, the pressure may then be applied to the semiconductor chip. In that case, steps S5 and S6 are first executed, for example, and if YES is selected in step S6, steps S1–S4 are executed; if YES is selected in step S4, steps S7–S9 are executed. Alternatively, heating of and pressure application to the semiconductor chip may be started simultaneously, and when the semiconductor chip temperature has reached above a setup temperature, the resistance value of the contact resistor has reached below a first setup value, and the resistance value of the daisy-chain resistor has reached below a second setup value, then the pressure and heating temperature applied to the semiconductor chip may be kept constant, under which condition after a predetermined period of time has passed, the heating temperature for the semiconductor chip may be decreased.

In the above embodiment, the resistance values across the contact resistor and daisy-chain resistor are detected; however, the configuration may be such that only the resistance value of the contact resistor is detected.

Furthermore, the anisotropic conductive film is used as a bonding material in the above embodiment, but this is not a limitation of the present invention. The bonding material may be such that a semiconductor chip and substrate are bonded together.

As described above, according to the optimum condition detection method for flip-chip bonding, the pressure applied to the semiconductor chip is increased at a first predetermined rate so that the semiconductor chip is pressed against the substrate until the contact resistance applied through a bonding material, such as anisotropic conductive film, between the bump of the semiconductor chip and the pad of the substrate reaches below a first setup value; the heating temperature for the semiconductor chip is increased at a second predetermined rate until the temperature of the semiconductor chip reaches above a setup temperature; when the contact resistance has reached below the first setup value and the semiconductor chip temperature has reached above the setup temperature, the pressure and heating temperature applied to the semiconductor chip are maintained constant, under which condition after a predetermined period of time has passed, the heating temperature for the semiconductor chip is decreased; thus, the pressure and heating temperature can be easily determined during flip-chip bonding implemented by use of a bonding material such that the contact resistance can be reduced sufficiently.

What is claimed is:

1. An optimum condition detection method for flip-chip bonding, where a bonding material is inserted between a semiconductor chip and a substrate to implement flip-chip bonding, said method comprising:

a first step wherein pressure applied to said semiconductor chip is increased at a first predetermined rate so that said semiconductor chip is pressed against said substrate until contact resistance applied through said bonding material between at least one of a plurality of bumps of said semiconductor chip and a pad of said substrate corresponding to the bump reaches below a first setup value;

a second step wherein when said contact resistance has reached below said first setup value, the pressure applied to said semiconductor chip is kept constant, and the heating temperature for said semiconductor chip is increased at a second predetermined rate until the temperature of said semiconductor chip reaches above a setup temperature; and a third step wherein when the temperature of said semiconductor chip has reached above said setup temperature, the pressure applied to said semiconductor chip and the heating temperature for said semiconductor chip are kept constant, under which condition after a predetermined period of time has passed, the heating temperature for said semiconductor chip is decreased.

2. An optimum condition detection method according to claim 1, wherein in said first step, when said contact resistance has reached below said first setup value, said second step is entered if the total resistance value of contact resistances applied through said bonding material between each of the plurality of bumps except for said one bump and their corresponding ones of said plurality of pads except for said one pad is below a second setup value.

3. An optimum condition detection method for flip-chip bonding, where a bonding material is inserted between a semiconductor chip and a substrate to implement flip-chip bonding, said method comprising:

a third step wherein heating temperature for said semiconductor chip is increased at a second predetermined rate until the temperature of said semiconductor chip reaches above a setup temperature;

a first step wherein when the temperature of said semiconductor chip has reached above said setup temperature, pressure applied to said semiconductor chip is increased at a first predetermined rate so that said semiconductor chip is pressed against said substrate until contact resistance applied through said bonding material between at least one of a plurality of bumps of said semiconductor chip and a pad of said substrate corresponding to the bump reaches below a first setup value; and a second step wherein when said contact resistance has reached said first setup value, the pressure applied to said semiconductor chip and the heating temperature for said semiconductor chip are kept constant, under which condition after a predetermined period of time has passed, the heating temperature for said semiconductor chip is decreased.

4. An optimum condition detection method according to claim 3, wherein in said first step, when said contact resistance has reached below said first setup value, said second step is entered if the total resistance value of contact resistances applied through said bonding material between each of the plurality of bumps except for said one bump and their corresponding ones of said plurality of pads except for said one pad is below a second setup value.

5. An optimum condition detection method or flip-chip bonding, where a bonding material is inserted between a semiconductor chip and a substrate to implement flip-chip bonding, said method comprising:

a first step wherein pressure applied to said semiconductor chip is increased at a first predetermined rate so that said semiconductor chip is pressed against said substrate until contact resistance applied through said bonding material between at least one of a plurality of bumps of said semiconductor chip and a pad of said substrate corresponding to the bump reaches below a first setup value, while, at the same time, heating temperature for said semiconductor chip is increased at a second predetermined rate until the temperature of said semiconductor chip reaches above a setup temperature; and a second step wherein when said contact resistance has reached below said first setup value and said semiconductor chip temperature has reached above said setup temperature, the pressure applied to said semiconductor chip and the heating temperature for said semiconductor chip are kept constant, under which condition after a predetermined period of time has passed, the heating temperature for said semiconductor chip is decreased.

6. An optimum condition detection method according to claim 5, wherein in said first step, when said contact resistance has reached below said first setup value, said second step is entered if the total resistance value of contact resistances applied through said bonding material between each of the plurality of bumps except for said one bump and their corresponding ones of said plurality of pads except for said one pad is below a second setup value.

* * * * *